US007227354B2

(12) United States Patent
Obama et al.

(10) Patent No.: US 7,227,354 B2
(45) Date of Patent: Jun. 5, 2007

(54) MAGNETIC MATERIAL AMOUNT DETECTING APPARATUS

(75) Inventors: Masao Obama, Yokosuka (JP); Masashi Suzuki, Yokosuka (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 214 days.

(21) Appl. No.: 11/014,173

(22) Filed: Dec. 17, 2004

(65) Prior Publication Data

US 2005/0140365 A1 Jun. 30, 2005

(30) Foreign Application Priority Data

Dec. 22, 2003 (JP) ............................ 2003-424218

(51) Int. Cl.
*G01N 27/72* (2006.01)
*G01R 33/12* (2006.01)

(52) U.S. Cl. ...................................................... 324/228

(58) Field of Classification Search ................. 324/228
See application file for complete search history.

(56) References Cited

U.S. PATENT DOCUMENTS 2,875,429 A * 2/1959 Quade ........................ 360/119
4,622,542 A 11/1986 Weaver
5,278,500 A 1/1994 Seitz
6,289,141 B1 9/2001 Roseman
7,012,424 B2 * 3/2006 Obama et al. .............. 324/232

FOREIGN PATENT DOCUMENTS

EP 0611164 A1 8/1994
JP 62-36540 2/1987

OTHER PUBLICATIONS

European Search Report dated Apr. 18, 2005 for Appln. No. EP 04 02 9591.

* cited by examiner

*Primary Examiner*—Reena Aurora
(74) *Attorney, Agent, or Firm*—Pillsbury Winthrop Shaw Pittman, LLP

(57) ABSTRACT

A magnetic material amount detecting apparatus includes primary winding and secondary winding which are wound on a core having a reading section to which a to-be-detected medium is set close. A current is supplied to the primary winding and an output signal from the primary winding is adjusted by an A.C. current detecting section. Then, a difference between the output signal output from the primary winding and adjusted by the A.C. current detecting section and an output signal from the secondary winding is output as a signal indicating the amount of magnetic material which is present near the reading section.

20 Claims, 8 Drawing Sheets

MAGNETIC MATERIAL AMOUNT DETECTING APPARATUS

CROSS-REFERENCE TO RELATED APPLICATIONS

This application is based upon and claims the benefit of priority from prior Japanese Patent Application No. 2003-424218, filed Dec. 22, 2003, the entire contents of which are incorporated herein by reference.

BACKGROUND OF THE INVENTION

1. Field of the Invention

This invention relates to a magnetic material amount detecting apparatus which detects a small amount of magnetic material contained in a magnetic ink to be printed on sheets of paper such as securities, for example.

2. Description of the Related Art

A forgery prevention measure using a magnetic material is currently in wide use for bills and securities. For example, printing is done on bills or securities by use of a magnetic ink. Further, some bills or securities have a long, narrow strip-form magnetic material watermarked therein. Truth determination is made for the above sheets of paper by using the magnetic material amount detecting apparatus to detect the magnetic ink or strip-form magnetic material in the distribution stage thereof.

The magnetic material amount detecting apparatus which carries out truth determination for the above sheets of paper has a magnetic head to detect the magnetic material in the sheet of paper. In the above magnetic material amount detecting apparatus, a magnetic head of a differential winding type transform system, D.C. excitation system or impedance system is used.

In the magnetic head of the differential winding type transform system, a primary winding is mounted on the central portion of an S-shaped core and secondary windings are wound on portions thereof which are set near the small gaps on the two opening sides. In the magnetic material amount detecting apparatus using the magnetic head with the above configuration, a magnetic material contained in a sheet of paper which is passed near one of the opening portions of the magnetic head is detected by use of a difference between induced voltages caused by the two secondary windings.

In the magnetic head of the D.C. excitation system, a small gap is formed in part of an annular core on which primary and secondary windings are mounted. In the magnetic material amount detecting apparatus using the magnetic head with the above configuration, a D.C. current is supplied through the primary winding and a variation in the magnetic flux caused in the annular core when a magnetic material passes on the gap formed in the magnetic head is sensed based on induced voltage of the secondary winding.

In the magnetic head of the impedance system, a small gap is formed in part of an annular core. The magnetic head of this type is used to detect a variation in the magnetic flux caused in the annular core when a magnetic material passes over the gap as a variation in the impedance of the winding wound on the core by use of an A.C. bridge circuit. Further, there is provided a method for applying a magnetic bias to a magneto-resistance element by use of a permanent magnet and detecting a variation in the magnetic field caused when the magnetic material is set closer to or separated apart from the magneto-resistance element as a variation in the resistance thereof.

However, in the magnetic material amount detecting apparatus using the magnetic head of the differential winding type transform system, it is necessary to obtain a signal which varies in proportion to a magnetic material amount while compensating for a variation in the magnetic permeability due to a temperature variation. Therefore, the magnetic material amount detecting apparatus using the magnetic head of the differential winding type transform system has a disadvantage that the cost becomes high because a plurality of cores and windings are necessary and impedances on the detecting side and compensating side are required to be adjusted.

Further, in the magnetic material amount detecting apparatus using the magnetic head of the impedance system, it is required to combine two sets of magnetic heads in order to temperature-compensate the core. Therefore, the magnetic material amount detecting apparatus using the magnetic head of the impedance system has a disadvantage that the cost becomes as high as the magnetic material amount detecting apparatus using the magnetic head of the differential winding type transform system.

In the magnetic material amount detecting apparatus using the magnetic head of the D.C. excitation system, an output signal derived from the magnetic material varies in proportion to the traveling speed of the magnetic material. Therefore, the magnetic material amount detecting apparatus using the magnetic head of the D.C. excitation system has a disadvantage that a detected signal is not always set equal to a signal value which varies in proportion to the magnetic material amount.

Further, the magnetic material amount detecting apparatus using the magnetic head of the magneto-resistance system has a structure in which two magneto-resistance elements are arranged on the same plane in order to reduce the influence of a temperature drift and a difference in the magnetic strength between the two elements is output as a signal. Thus, in the magnetic material amount detecting apparatus using the magnetic head of the magneto-resistance system, a difference between the amounts of spatial magnetic materials on the two elements is derived instead of the magnetic material amount. That is, the magnetic material amount detecting apparatus using the magnetic head of the magneto-resistance system has a disadvantage that a signal indicating the precise magnetic material amount is not derived.

BRIEF SUMMARY OF THE INVENTION

An object of this invention is to provide an inexpensive magnetic material amount detecting apparatus which can detect a signal proportional to a magnetic material amount without fail.

A magnetic material amount detecting apparatus according to an aspect of the present invention which detects a magnetic material contained in a to-be-detected medium comprises a magnetic head having primary and secondary windings mounted on a core having a reading section to which the to-be-detected medium is set to be close, a current supply circuit which supplies a current to the primary winding of the magnetic head, an adjusting circuit which adjusts an output signal from the primary winding, and a processing circuit which outputs a difference between the output signal output from the primary winding and adjusted by the adjusting circuit and an output signal from the secondary winding.

A magnetic material amount detecting apparatus according to another aspect of the present invention which detects a magnetic material contained in a to-be-detected medium comprises a magnetic head having primary and secondary windings mounted on a core having a reading section to which the to-be-detected medium is set to be close, a current supply circuit which supplies a current to the primary winding of the magnetic head, a first adjusting circuit which adjusts an output signal from the primary winding, a processing circuit which outputs a difference between the output signal output from the primary winding and adjusted by the first adjusting circuit and an output signal from the secondary winding, a second adjusting circuit which adjusts the output signal from the primary winding, and a phase detection circuit which outputs a signal obtained by subjecting an output signal of the processing circuit to phase detection based on the output signal output from the primary winding and adjusted by the second adjusting circuit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

There will now be described preferable embodiments of this invention with reference to the accompanying drawings.

First, a first embodiment of this invention is explained.

Figure 1:
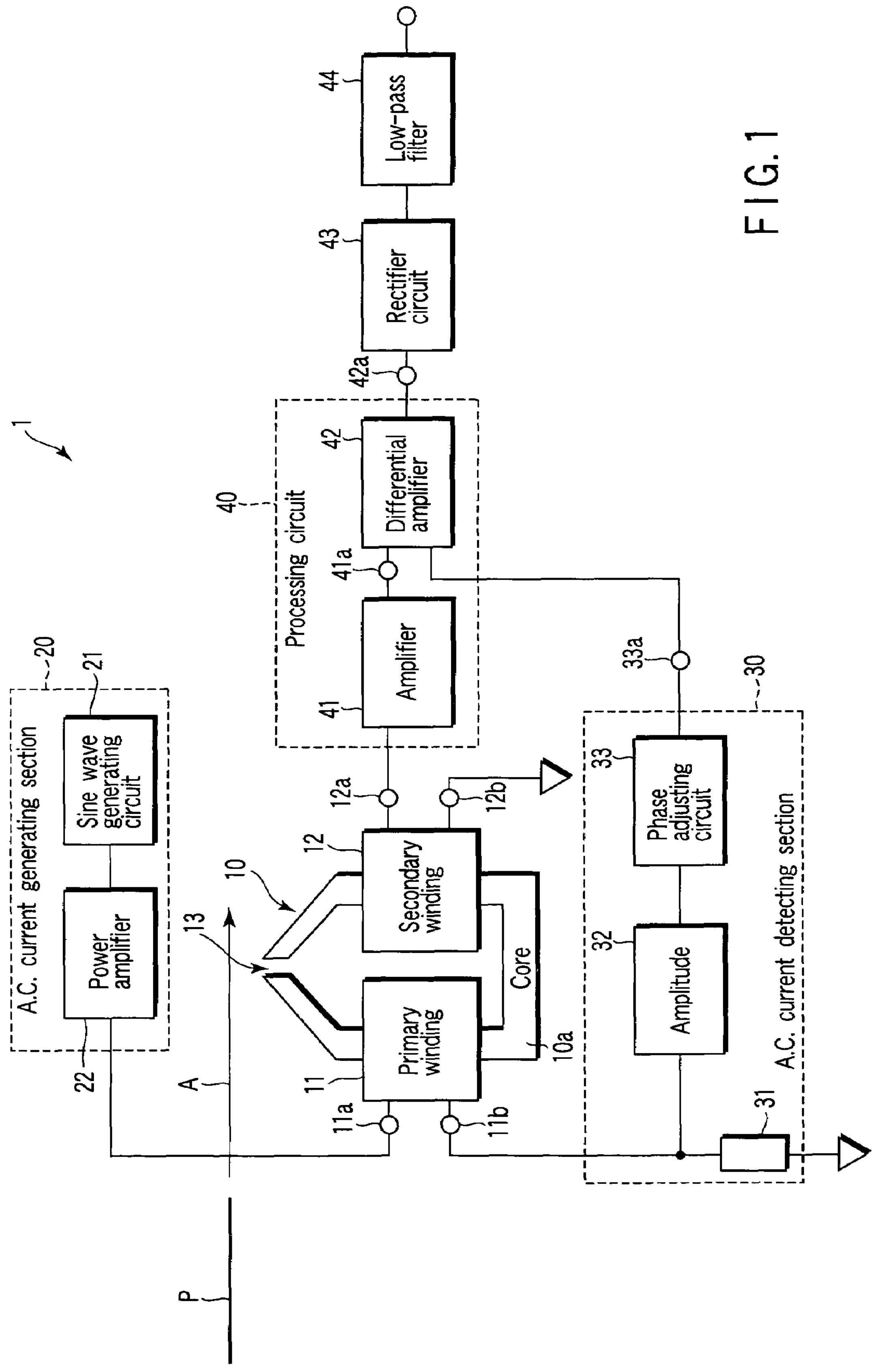
FIG. 1 is a diagram schematically showing an example of the configuration of a magnetic material amount detecting apparatus according to a first embodiment of this invention.

FIG. 1 is a diagram showing an example of the configuration of a magnetic material amount detecting apparatus 1 according to the first embodiment.

As shown in FIG. 1, the magnetic material amount detecting apparatus 1 of the first embodiment includes a magnetic head 10, A.C. current generating circuit 20, A.C. current detecting section 30, processing circuit 40, rectifier circuit 43 and low-pass filter 44.

The magnetic head 10 includes a core 10*a*, primary winding 11, secondary winding 12 and reading section 13. The core 10*a* is configured by a magnetic material. The primary winding 11 and secondary winding 12 are wound on the core in which a gap with preset width used as the reading section 13 is formed. In the reading section 13, a leakage flux caused by a magnetic field generated in the core 10*a* is generated.

Therefore, in the magnetic head 10, if a sheet of paper P used as a to-be-detected medium passes near the reading section 13 in a direction A in FIG. 1 in a state in which an A.C. current is supplied to the primary winding 11, an output signal containing a signal corresponding to an amount of magnetic material contained in the sheet of paper P used as the to-be-detected medium is output from the secondary winding 12.

The A.C. current generating circuit 20 includes a sine wave generating circuit 21 and power amplifier 22. The sine wave generating circuit 21 is a circuit which generates a sine wave signal. An output signal of the sine wave generating circuit 21 is input to the power amplifier 22. The power amplifier 22 is a circuit which generates a power supply signal. The power amplifier 22 outputs an A.C. current based on a sine wave signal generated from the sine wave generating circuit 21. The A.C. current generating circuit 20 is connected to one input terminal 11*a* of the primary winding 11 of the magnetic head 10. With the above configuration, the A.C. current as an output signal of the power amplifier 22 is supplied to one input terminal 11*a* of the primary winding 11 of the magnetic head 10.

The A.C. current detecting section 30 is a circuit which detects an A.C. current flowing in the primary winding 11. The A.C. current detecting section 30 includes an A.C. current detecting resistor 31, amplitude adjusting circuit 32 and phase adjusting circuit 33. The A.C. current detecting resistor 31 is a resistor which detects an A.C. current flowing in the primary winding 11. One terminal of the A.C. current detecting resistor 31 is connected to a terminal 11*b* of the primary winding 11 of the magnetic head 10. Further, the other terminal of the A.C. current detecting resistor 31 is connected to a reference potential (0V) node.

The amplitude adjusting circuit 32 is a circuit which amplifies a detection signal detected by the A.C. current detecting resistor 31. The input terminal of the amplitude adjusting circuit 32 is connected to a connection node of the other terminal 11*b* of the primary winding 11 and the A.C. current detecting resistor 31. The phase adjusting circuit 33 adjusts the phase of an output signal of the amplitude adjusting circuit 32. The input terminal of the phase adjusting circuit 33 is connected to the output terminal of the amplitude adjusting circuit 32. With the above configuration, the A.C. current detecting section 30 adjusts the amplitude and phase of the A.C. current flowing in the primary winding 11 and supplies the thus adjusted current to the processing circuit 40.

The processing circuit 40 is a circuit which processes an output signal of the secondary winding 12. The processing circuit 40 includes an amplifier 41 and differential amplifier 42. The amplifier 41 amplifies a signal output from the secondary winding 12 of the magnetic head 10. The input terminal of the amplifier 41 is connected to one terminal 12*a* of the secondary winding 12. The differential amplifier 42 amplifies a difference between the output signal of the amplifier 41 and the output signal of the A.C. current detecting section 30. The input terminal of the differential amplifier 42 is connected to the output terminal 41*a* of the amplifier 41 and the output terminal 33*a* of the phase adjusting circuit 33 of the A.C. current detecting section 30.

With the above configuration, in the processing circuit 40, a signal corresponding to the amount of magnetic material contained in the sheet of paper P is output. That is, in the processing circuit 40, a signal corresponding to the amount of magnetic material contained in the sheet of paper P is output as a difference between the output signal of the secondary winding 12 and the output signal of the primary winding 11 whose amplitude and phase are adjusted.

The rectifier circuit 43 is a rectifier circuit such as a full-wave rectifier circuit or half-wave rectifier circuit. The rectifier circuit 43 is connected to the output terminal 42*a* of the differential amplifier 42 of the processing circuit 40. With the above configuration, in the rectifier circuit 43, a signal corresponding to the amount of magnetic material contained in the sheet of paper P as an output signal from the processing circuit 40 is rectified.

The low-pass filter 44 is a circuit which smoothens the input signal, converting it to a signal of a frequency lower than a preset frequency. The low-pass filter 44 is configured by a smoothing circuit which includes a filter having a cut-off frequency lower than a sine wave oscillation frequency of the sine wave generating circuit 21, for example. The input terminal of the low-pass filter 44 is connected to the output terminal of the rectifier circuit 43.

With the above configuration, the low-pass filter 44 smoothens the output signal from the rectifier circuit 43, generating a signal of a frequency lower than the sine wave oscillation frequency (i.e., the frequency of the A.C. power supply) of the sine wave generating circuit 21. Therefore, the output signal of the low-pass filter 44 is set to a D.C. signal obtained by smoothing the output signal of the rectifier circuit 43. The output signal of the low-pass filter 44 becomes a D.C. signal corresponding to the amount of magnetic material contained in the sheet of paper P and the result of detection indicating the amount of magnetic material contained in the sheet of paper P is derived from the magnetic material amount detecting apparatus 1.

Next, the operation of the magnetic material amount detecting apparatus 1 with the above configuration is explained.

First, a case wherein the sheet of paper P containing a magnetic material is not present near the reading section 13 of the magnetic head 10 is explained.

The power amplifier 22 of the A.C. current generating circuit 20 supplies an A.C. current to the primary winding 11 of the magnetic head 10. Then, in the magnetic head 10, an A.C. magnetic field is caused by the primary winding 11. By the A.C. magnetic field, the secondary winding 12 of the magnetic head 10 outputs an A.C. voltage.

In this state, if no magnetic material is present near the reading section 13 of the magnetic head 10, a difference between the current signal of the primary winding 11 and the output signal of the secondary winding 12 is set to be minimum (that is, the current signal of the primary winding 11 and the output signal of the secondary winding 12 are set as close as possible to each other) in the magnetic material amount detecting apparatus 1.

In the magnetic material amount detecting apparatus 1 shown in FIG. 1, a difference between an output signal of the amplifier 41 obtained by amplifying the output signal of the secondary winding 12 and an output signal of the phase adjusting circuit 33 of the A.C. current detecting section 30 is adjusted to become minimum in a state wherein no magnetic material is present near the reading section 13 of the magnetic head 10. Further, in the magnetic material amount detecting apparatus 1, the phases and amplitudes of the output signals of the primary winding 11 and the secondary winding 12 are adjusted.

With the circuit configuration of FIG. 1, the amplitude of the output signal of the primary winding 11 is adjusted by the amplitude adjusting circuit 32 so as to be set as close as possible to the amplitude of a signal obtained by amplifying the output signal of the secondary winding 12 by use of the amplifier 41. Further, the phase of the output signal of the primary winding 11 is adjusted by the phase adjusting circuit 33 so as to be set as close as possible to the phase of the output signal of the secondary winding 12.

Next, the operation of the magnetic material amount detecting apparatus 1 in a case where the sheet of paper P containing a magnetic material is not present near the reading section 13 of the magnetic head 10 is explained.

If the A.C. current generating circuit 20 supplies an A.C. current to the primary winding 11 of the magnetic head 10, an A.C. magnetic field is caused in the reading section 13 of the magnetic head 10. In this state, an A.C. voltage inducing in the secondary winding 12 is amplified by the amplifier 41.

A signal amplified by the amplifier 41 is input to a terminal (for example,—input terminal) which is one of the paired input terminals of the differential amplifier 42. Further, an A.C. current flowing in the primary winding 11 is detected by the A.C. current detecting section 30. A signal detected by the A.C. current detecting section 30 is input to a terminal (for example, + input terminal) which is the other one of the paired input terminals of the differential amplifier 42.

In the A.C. current detecting section 30, an electrical signal flowing in the primary winding 11 is detected by the A.C. current detecting resistor 31. The amplitude of the output signal of the primary winding 11 detected by the A.C. current detecting resistor 31 is adjusted by the amplitude adjusting circuit 32. In the amplitude adjusting circuit 32, the signal detected from the primary winding 11 is adjusted so as to be set approximately equal to the amplitude of the output signal of the amplifier 41 in a state where no magnetic material is present near the reading section 13 of the magnetic head 10.

The phase of the signal whose amplitude is adjusted by the amplitude adjusting circuit 32 is adjusted by the phase adjusting circuit 33. In the phase adjusting circuit 33, the signal detected from the primary winding 11 is adjusted so as to be set approximately equal to the phase of the output signal of the amplifier 41 in a state where no magnetic material is present near the reading section 13 of the magnetic head 10.

As a result, the output signal of the phase adjusting circuit 33 as the output signal of the A.C. current detecting section 30 has substantially the same amplitude and phase as those of the output signal of the amplifier 41 in a state where no magnetic material is present near the reading section 13 of the magnetic head 10.

In the differential amplifier 42, a difference between two signals input via the paired input terminals is amplified. Therefore, the differential amplifier 42 outputs a signal obtained by amplifying a difference between the output signal of the amplifier 41 which is input to one of the paired input terminals and the output signal of the phase adjusting circuit 33 which is input to the other input terminal. In this case, since the two input signals are substantially equal to each other (the difference between the input signals is set to substantially "0"), the output signal of the differential amplifier 42 is set to substantially "0".

Further, the output signal of the differential amplifier 42 passes through the rectifier circuit 43 and low-pass filter 44 and is output. In this case, the output signal of the differential amplifier 42 is set at substantially "0". Therefore, the output signal of the low-pass filter 44 as the output signal of the magnetic material amount detecting apparatus 1 is set to substantially "0". The value of the above output signal indicates an amount of magnetic material which lies near the reading section 13. Therefore, if the output signal of the differential amplifier 42 is "0", it is indicated that the magnetic material is not present near the reading section 13.

Next, the operation in the case where the magnetic material is set near the reading section 13 of the magnetic head 10 is explained.

If the A.C. current generating circuit 20 supplies an A.C. current to the primary winding 11 of the magnetic head 10, an A.C. magnetic field is generated in the reading section 13 of the magnetic head 10. In this state, if the magnetic material is set closer to the reading section 13, the A.C. magnetic field generated in the reading section 13 is attracted toward the magnetic material and is changed in terms of direction. Therefore, the strength of the A.C. magnetic field generated in the magnetic head 10 varies.

A variation in the strength of the A.C. magnetic field generated in the magnetic head 10 appears as an output variation of the secondary winding 12 of the magnetic head 10. An output signal of the secondary winding 12 is obtained by superposing a signal (which is a magnetic signal in this example) indicating a variation in the strength of the A.C. magnetic field generated in the magnetic material lying near the reading section 13 on a signal (which is an A.C. signal in this example) generated by the A.C. current supplied to the primary winding 11.

That is, the output signal of the secondary winding 12 becomes a signal which contains an A.C. signal generated in the secondary winding 12 by the A.C. current supplied to the primary winding 11 and a magnetic signal generated in the secondary winding 12 by setting the magnetic material contained in the sheet of paper P near the reading section 13. In this case, the A.C. signal generated in the secondary winding is sufficiently larger than the magnetic signal. Therefore, the magnetic signal generated in the secondary winding 12 is set in a superposed form on the A.C. signal caused by A.C. excitation.

Thus, the output signal of the secondary winding 12 which has the magnetic signal superposed on the A.C. signal is amplified by the amplifier 41 and input to the input terminal which is one of the paired input terminals of the differential amplifier 42.

On the other hand, the magnetic signal caused by the magnetic material near the reading section 13 and contained in the output signal of the primary winding 11 is negligibly small. Therefore, in the A.C. current detecting section 30, only the A.C. signal is detected. As a result, an A.C. signal as the output signal of the primary winding 11 is input to the other input terminal of the differential amplifier 42.

Further, as described before, the A.C. signal as the output signal of the A.C. current detecting section 30 is adjusted to have substantially the same amplitude and phase as those of the A.C. signal amplified by the amplifier 41. Therefore, the output signal of the differential amplifier 42 becomes a signal indicating a magnetic signal component obtained by removing an A.C. signal component from the output signal of the secondary winding 12 amplified by the amplifier 41. In other words, the differential amplifier 42 subtracts the A.C. signal component from the output signal of the secondary winding 12 amplified by the amplifier 41.

Thus, the output signal of the differential amplifier 42 is a magnetic signal indicating an output variation caused by the magnetic material contained in the to-be-detected medium P. Further, the magnetic signal is a signal having the positive or negative signal amplitude and indicating the amount of magnetic material contained in the to-be-detected medium P.

Further, the magnetic signal as the output signal of the differential amplifier 42 is subjected to full-wave rectification by the rectifier circuit 43. The magnetic signal subjected to the full-wave rectification by the rectifier circuit 43 is smoothed by the low-pass filter 44. Thus, an output signal of the low-pass filter 44 as the output signal of the magnetic material amount detecting apparatus 1 is used as a D.C. signal indicating an amount of magnetic material contained in the to-be-detected medium P which lies near the reading section 13.

As described above, in the magnetic material amount detecting apparatus 1 of the first embodiment, the A.C. current detecting section which detects a current signal flowing in the primary winding 11 of the magnetic head 10 having the reading section 13 to which the to-be-detected medium P is set close is provided. Further, the current signal of the primary winding 11 is subtracted from the induced voltage signal of the secondary winding 12 of the magnetic head 10 and an amount of magnetic material contained in the to-be-detected medium P is detected by use of a signal obtained by subtracting the current signal of the primary winding 11 from the induced voltage signal of the secondary winding 12 of the magnetic head 10.

As a result, a magnetic material amount detecting apparatus which can stably detect an amount of magnetic material contained in the to-be-detected medium P by use of an inexpensive magnetic head with a simple configuration can be provided. Further, even when the magnetic permeability of the magnetic head varies due to external temperature, an amount of magnetic material contained in the to-be-detected medium P can be detected by use of the above magnetic material amount detecting apparatus.

Next, a second embodiment of this invention is explained.

Figure 2:
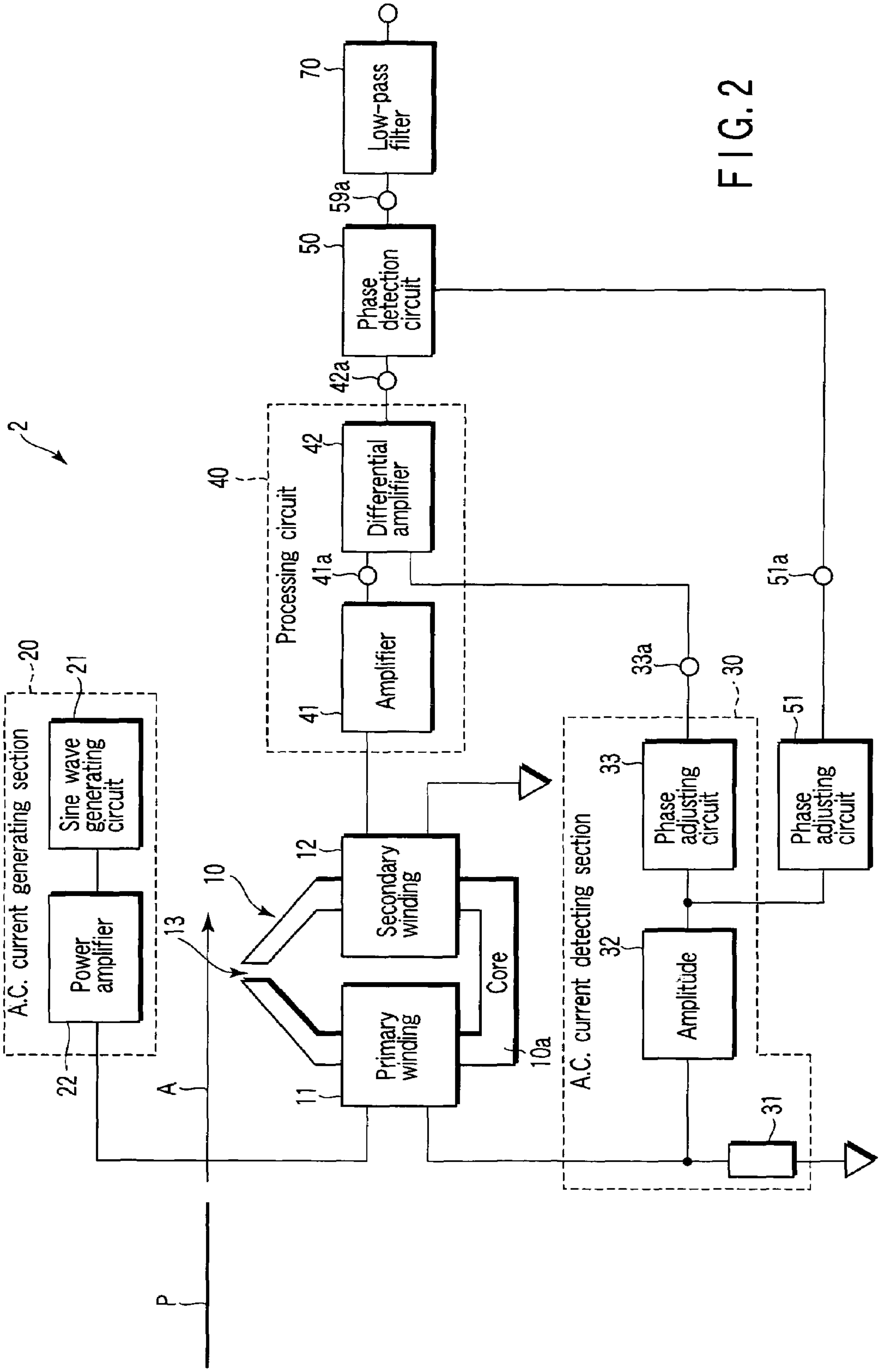
FIG. 2 is a diagram schematically showing an example of the configuration of a magnetic material amount detecting apparatus according to a second embodiment of this invention.

FIG. 2 is a diagram showing an example of the configuration of a magnetic material amount detecting apparatus 2 according to the second embodiment.

In the magnetic material amount detecting apparatus 2 shown in FIG. 2, portions which are the same as those of FIG. 1 are denoted by the same reference symbols and the detail explanation thereof is omitted. As shown in FIG. 2, the magnetic material amount detecting apparatus 2 is different from the magnetic material amount detecting apparatus 1 shown in FIG. 1 in the configuration of the succeeding stage of the differential amplifier 42. In the magnetic material amount detecting apparatus 2, a phase detection circuit 50 and low-pass filter 70 are used instead of the rectifier circuit 43 and low-pass filter of the magnetic material amount detecting apparatus 1 shown in FIG. 1 and a phase adjusting circuit 51 is additionally used.

The phase detection circuit 50 is a circuit which subjects an output signal of the differential amplifier 42 to synchronous detection based on the phase of a signal from the phase adjusting circuit 51. One of the two input terminals of the phase detection circuit 50 is connected to the output terminal of the differential amplifier 42 and the other input terminal is connected to the output terminal of the phase adjusting circuit 51. Further, the output terminal of the phase detection circuit 50 is connected to the input terminal of the low-pass filter 70.

The phase adjusting circuit 51 is a circuit which adjusts the phase of an output signal of the amplitude adjusting circuit 32. The input terminal of the phase adjusting circuit 51 is connected to the output terminal of the amplitude adjusting circuit 32. The phase adjusting circuit 51 adjusts the phase difference between an output signal (A.C. signal) detected from the primary winding 11 and a magnetic signal which is caused by the magnetic material of a to-be-detected medium P and contained in an output signal from the secondary winding 12. Further, the phase adjusting circuit 51 is adjusted according to the characteristic of the magnetic material of the to-be-detected medium in order to adjust the phase of a signal obtained from the primary winding 11 so that the phase of the signal will be synchronized with the phase of the magnetic signal.

The phase adjusting circuit 51 adjusts the phase of an output signal (A.C. signal) detected from the primary winding 11 so that the phase of the output signal will be set equal to the phase of the magnetic signal which is caused by the magnetic material of the to-be-detected medium P and contained in the output signal from the secondary winding 12. On the other hand, the phase adjusting circuit 33 is a circuit which adjusts the phase of an output signal (A.C. signal) detected from the primary winding 11 so as to set the phase of the above output signal equal to the phase of an A.C. signal contained in the output signal from the secondary winding 12. Therefore, the phase adjusting circuit 51 can be adjusted (set) separately from the phase adjusting circuit 33.

With the above configuration, the phase detection circuit 50 rectifies an output signal of the differential amplifier 42 by performing the synchronous detecting operation according to the phase of a magnetic signal (output signal from the phase adjusting circuit 51) which is caused by the magnetic material of the to-be-detected medium P and contained in the output signal from the secondary winding 12.

Further, the low-pass filter 70 is a circuit that smoothes input signal, generating a signal of a frequency lower than a preset frequency in an input signal. The input terminal of the low-pass filter 70 is connected to the output terminal of the phase detection circuit 50. With this configuration, an output signal of the low-pass filter 70 becomes a D.C. signal obtained by smoothing the output signal from the phase detection circuit 50. The output signal of the low-pass filter 70 is a D.C. signal corresponding to the amount of magnetic material contained in the to-be-detected medium P and is used as the result of detection by the magnetic material amount detecting apparatus 2 which indicates the amount of magnetic material contained in the to-be-detected medium P.

Next, the phase detection circuit 50 is explained in detail.

Figure 3:
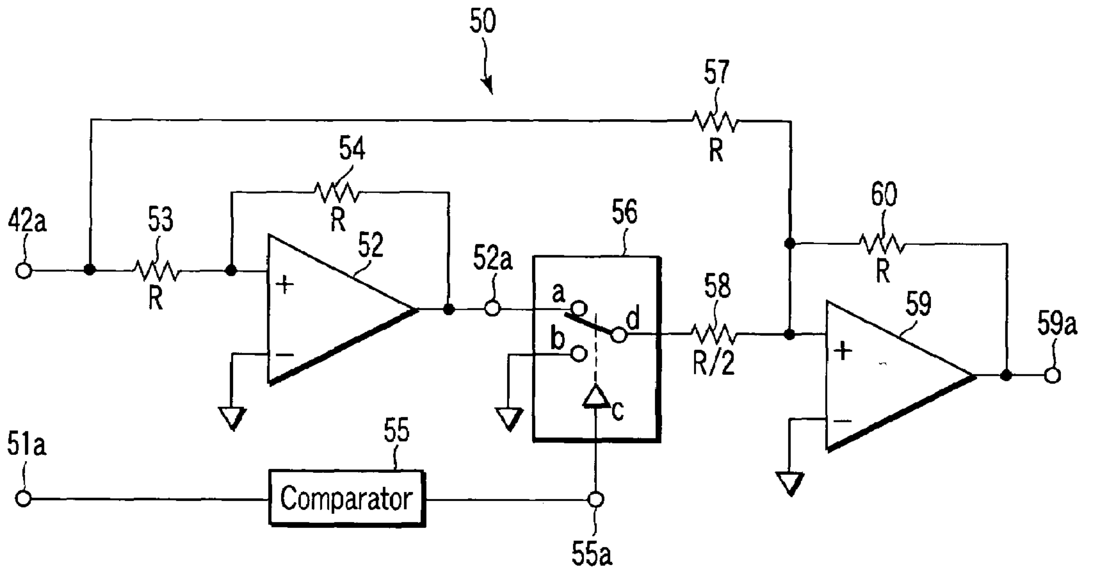
FIG. 3 is a diagram showing an example of the configuration of a phase detection circuit.

FIG. 3 is a diagram showing an example of the configuration of the phase detection circuit 50.

The phase detection circuit 50 includes an inverting amplifier 52, resistor 53, resistor 54, comparator 55, selection switch 56, resistor 57, resistor 58, resistor 60 and inverting amplifier 59.

The inverting amplifier 52 inverts an input signal from an output terminal 42*a* of the differential amplifier 42. One of the two input terminals of the inverting amplifier 52 is connected to the output terminal 42*a* of the differential amplifier 42 via the resistor 53 and the other input terminal is grounded. The output terminal of the inverting amplifier 52 is connected to a contact “a” of the selection switch 56 which will be described later.

The comparator 55 outputs an output signal corresponding to the phase of a signal from the phase adjusting circuit 51. The output signal of the comparator 55 is used as a control signal of the selection switch 56. The input terminal of the comparator 55 is connected to the output terminal of the phase adjusting circuit 51. The output terminal of the comparator 55 is connected to an input terminal “c” of the selection switch 56.

In this example, it is assumed that the comparator 55 compares the output signal of the phase adjusting circuit 51 with reference voltage (which is 0V in this example) and outputs the comparison result as a rectangular signal of “1” or “0”. For example, if the output signal of the phase adjusting circuit 51 is not lower than the reference voltage (that is, the output signal of the phase adjusting circuit 51 is equal to or higher than 0V), the comparator 55 outputs “1” to the selection switch 56. Further, if the output signal of the phase adjusting circuit 51 is lower than the reference voltage (that is, the output signal of the phase adjusting circuit 51 is lower than 0V), the comparator 55 outputs “0” to the selection switch 56.

The selection switch 56 is an analog switch having contacts “a”, “b”, an input terminal “c” for a control signal and a signal output terminal “d”. The contact “a” of the selection switch 56 is connected to an output terminal 52*a* of the inverting amplifier 52. The contact “b” of the selection switch 56 is grounded (0V). The terminal (contact) “d” of the selection switch 56 is connected to an input terminal of the inverting amplifier 59 via the resistor 58. Further, the input terminal "c" of the selection switch 56 is connected to the output terminal of the comparator 55. The selection switch 56 selectively sets the switching position of the switch by using the output signal of the comparator as a control signal.

With the above configuration, the selection switch 56 switches the connection state of the contact "a" or "b" with respect to the output terminal "d" according to a control signal input to the input terminal "c". For example, when the output terminal "d" is connected to the contact "a", the selection switch 56 outputs an output signal of the inverting amplifier 52 from the output terminal "d". Further, when the output terminal "d" is connected to the contact "b", the selection switch 56 outputs the reference voltage (0V) from the output terminal "d".

The inverting amplifier 59 inverts a signal obtained by adding a signal input from the differential amplifier 42 via the resistor 57 to a signal input from the selection switch 56 via the resistor 58. One of the two input terminals of the inverting amplifier 59 is connected to the output terminal 42*a* of the differential amplifier 42 via the resistor 57 and connected to the terminal "d" of the selection switch 56 via the resistor 58 and the other input terminal thereof is grounded. The resistance (R/2) of the resistor 58 is set to half the resistance (R) of the resistor 57.

Next, the operation of the phase detection circuit 50 is explained.

FIGS. 4A to 4F are diagrams showing the waveforms of various signals for illustrating the operation of the phase detection circuit 50.

Figures 4A, 4B, 4C, 4D, 4E, 4F:
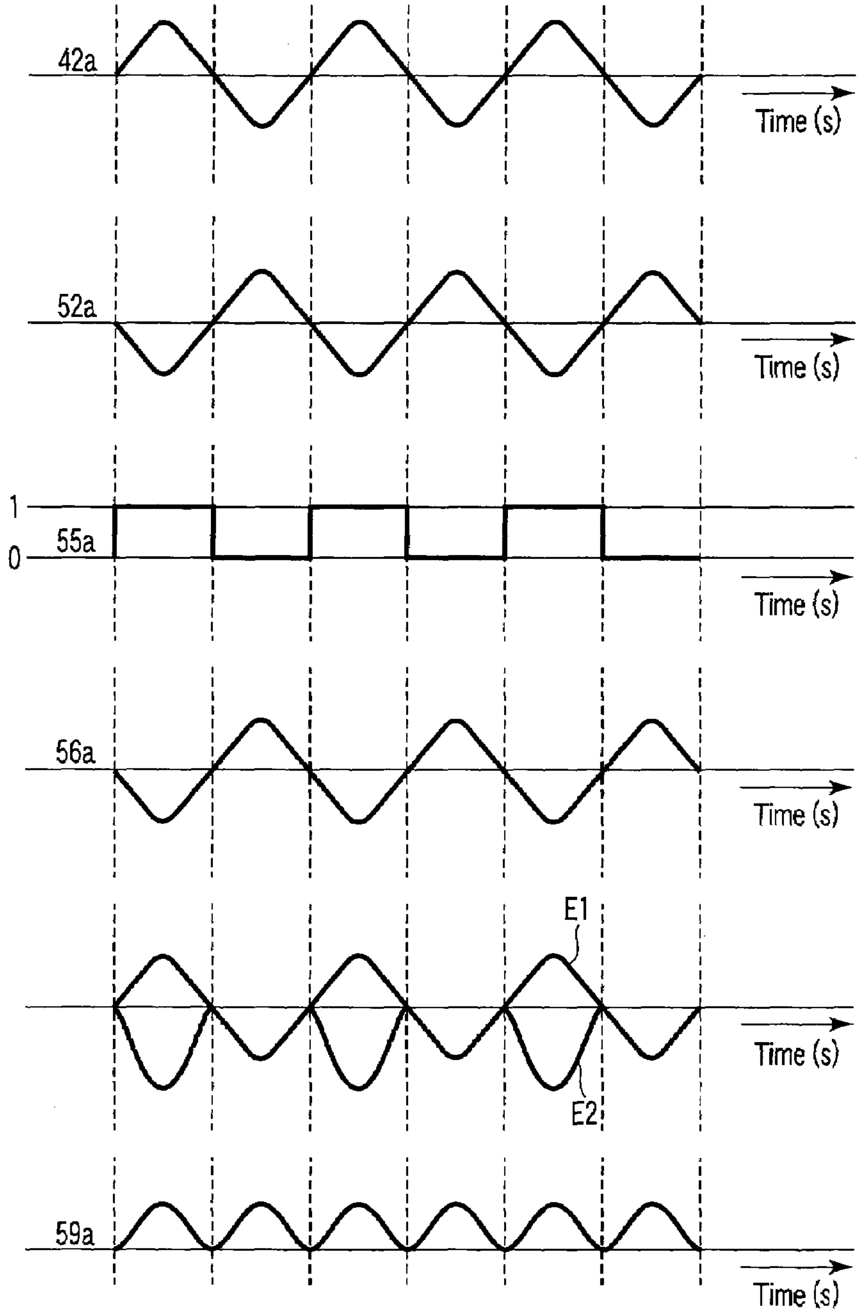
FIG. 4A is a diagram showing an example of an output signal of a differential amplifier as an input signal of the phase detection circuit.
FIG. 4B is a diagram showing an example of an output signal of an inverting amplifier with respect to an input signal of FIG. 4A.
FIG. 4C is a diagram showing an example of an output signal of a comparator as a detection signal of the phase detection circuit.
FIG. 4D is a diagram showing an example of a signal obtained by subjecting the signal of FIG. 4B to synchronous detection by use of the detection signal of FIG. 4C.
FIG. 4E is a diagram showing two input signals to an inverting amplifier which outputs an output signal of the phase detection circuit.
FIG. 4F is a diagram showing an example of an output signal of an inverting amplifier with respect to an input signal of FIG. 4E.

FIG. 4A shows an example of an output signal of the differential amplifier 42. FIG. 4B is a diagram showing a signal obtained by inverting the signal of FIG. 4A by use of the inverting amplifier 52 of the phase detection circuit 50. FIG. 4C is a diagram showing an example of an output signal (detection signal) of the comparator 50. FIG. 4D is a diagram showing a signal (a signal output from the output terminal "d" of the selection switch 56) obtained by outputting the signal of FIG. 4B according to the signal of FIG. 4C. FIG. 4E is a diagram showing a signal E1 input to the inverting amplifier 59 via the resistor 57 and a signal E2 input to the inverting amplifier 59 via the resistor 58. FIG. 4F is a diagram showing a signal obtained by inverting the sum signal of the two signals shown in FIG. 4E by use of the inverting amplifier 59.

As described before, the differential amplifier 42 outputs a signal (magnetic signal) which is caused by the magnetic material lying near the reading section 13 of the magnetic head 10 and contained in the output signal of the secondary winding 12. Therefore, the waveform of the signal shown in FIG. 4A is one example of the waveform of the magnetic signal detected by the magnetic head 10.

An output signal of the differential amplifier 42 shown in FIG. 4A is input to the phase detection circuit 50 via the terminal 42*a*. In the phase detection circuit 50, the output signal of the differential amplifier 42 which is input via the terminal 42*a* is inverted by the inverting amplifier 52. The waveform of the signal shown in FIG. 4B indicates a signal obtained by inverting the signal shown in FIG. 4A by use of the inverting amplifier 52.

A signal from the phase adjusting circuit 51 is input to the comparator 55 of the phase detection circuit 50. As described before, the phase adjusting circuit 51 adjusts the phase of the signal detected from the primary winding 11 to set the same to a phase (which is a phase of a magnetic signal contained in the output signal from the secondary winding 12) corresponding to the characteristic of the magnetic material contained in the to-be-detected medium P. Therefore, a signal of the phase corresponding to the phase of the magnetic signal contained in the output signal of the secondary winding 12 is input from the phase adjusting circuit 51 to the comparator 55.

The comparator 55 compares the signal from the phase adjusting circuit 51 with the reference voltage (in this example, 0V) and outputs the result of comparison as a rectangular wave. Therefore, the comparator 55 outputs a rectangular wave which is set to "1" or "0", respectively, when the signal from the phase adjusting circuit 51 is higher or lower than the reference voltage. Thus, the selection switch 56 switches the switching position when the rectangular wave as the output signal of the comparator 55 is changed from "1" to "0" or from "0" to "1".

As described before, in the comparator 55, a rectangular wave is output as the detection signal corresponding to the phase of the signal from the phase adjusting circuit 51. The reason why the output signal (detection signal) of the comparator 55 is set to the rectangular wave is to stably control the operation of the selection switch 56 which controls the output signal of the comparator 55.

If a signal having the same phase as that of the signal shown in FIG. 4A is input from the phase adjusting circuit 51 to the comparator 55, the comparator 55 outputs a signal of the rectangular waveform as shown in FIG. 4C. In this case, the output signal of the phase adjusting circuit 51 has the same phase as that of the signal shown in FIG. 4A. Therefore, the comparator 55 outputs the rectangular waveform which is synchronized with the waveform of FIG. 4A as a control signal of the selection switch 56.

In other words, the phase of the signal from the phase adjusting circuit 51 is adjusted to the same phase as the phase of a magnetic signal obtained when the magnetic material of the to-be-detected medium P is set close to the reading section 13. Therefore, the comparator 55 outputs a control signal which is synchronized with the phase of the magnetic signal to the selection switch 56.

It is assumed that the selection switch 56 connects the contact "a" to the terminal "d" when the control signal used as the output signal from the comparator 55 is set at "1" and connects the contact "b" to the terminal "d" when the control signal used as the output signal from the comparator 55 is set at "0". That is, the selection switch 56 changes the switching position to connect the contact "a" to the terminal "d" when the output signal of the comparator 55 is changed from "0" to "1". Further, the selection switch 56 changes the switching position to connect the contact "b" to the terminal "d" when the output signal of the comparator 55 is changed from "1" to "0".

Therefore, the selection switch 56 permits the output signal of the inverting amplifier 52 to be output in order to connect the contact "a" to the terminal "d" when the rectangular wave output from the comparator 55 is set at "1". Further, the selection switch 56 permits the output signal of the inverting amplifier 52 to be output in order to connect the contact "b" to the terminal "d" when the rectangular wave output from the comparator 55 is set at "0". Therefore, when the rectangular wave shown in FIG. 4C is output from the comparator 55, an output signal from the terminal "d" of the selection switch 56 becomes a signal of the waveform as shown in FIG. 4D. The output signal of the selection switch 56 shown in FIG. 4D is set to have the waveform of FIG. 4B when the output signal of the comparator 55 shown in FIG. 4C is "1" and is set to the reference voltage (0V) when the output signal of the comparator 55 shown in FIG. 4C is "0".

It is assumed that the selection switch 56 connects the contact "a" to the terminal "d" when the control signal used as the output signal from the comparator 55 is set at "1" and connects the contact "b" to the terminal "d" when the control signal used as the output signal from the comparator 55 is set at "0". That is, the selection switch 56 changes the switching position to connect the contact "a" to the terminal "d" when the output signal of the comparator 55 is changed from "0" to "1". Further, the selection switch 56 changes the switching position to connect the contact "b" to the terminal "d" when the output signal of the comparator 55 is changed from "1" to "0".

Two signals E1, E2 are input to one of the input terminals of the inverting amplifier 59 via the resistors 57, 58, respectively. The signal E1 is a signal obtained by inputting the output signal of the differential amplifier 42 to the inverting amplifier 59 via the resistor 57. The signal E2 is a signal obtained by inputting the output signal from the selection switch 56 to the inverting amplifier 59 via the resistor 58. Further, the resistance of the resistor 57 is set to R and the resistance of the input resistor 58 is set to R/2. Therefore, the signal E2 is a signal of the waveform which is twice the output signal of the selection switch 56. Thus, the output signal of the differential amplifier 42 and the signal which is twice the output signal of the selection switch 56 are input to one input terminal of the inverting amplifier 59.

For example, when the output signal of the differential amplifier 42 is a signal of the waveform shown in FIG. 4A and the output signal of the selection switch 56 is a signal of the waveform shown in FIG. 4D, the signals E1 and E2 are set to signals shown in FIG. 4E. In FIG. 4E, the signal E1 of FIG. 4A as the signal input to one input terminal of the inverting amplifier 59 and the signal E2 obtained by multiplying the signal of FIG. 4C by two are shown.

The signal E2 obtained by multiplying the output signal of the selection switch 56 by two is input to one input terminal of the inverting amplifier 59 together with the output signal E1 of the differential amplifier 42 and reference voltage (0V) is input to the other input terminal thereof. Therefore, the inverting amplifier 59 outputs a signal obtained by inverting a sum signal of the signals E1 and E2.

For example, when the signals E1 and E2 are the signals of the waveforms shown in FIG. 4E, the inverting amplifier 59 outputs a signal of the waveform shown in FIG. 4F. The signal of the waveform shown in FIG. 4F is a signal of the waveform obtained by adding together the signals E1 and E2 shown in FIG. 4E and inverting the thus added signal. Further, in FIG. 4F, a signal obtained by subjecting the output signal of the differential amplifier 42 to full-wave rectification is shown.

Next, the characteristic of the phase detection circuit 50 is explained.

FIGS. 5A to 5E and FIGS. 6A to 6E are diagrams showing the waveforms of various signals in the process of the operation in the phase detection circuit 50.

Figure 5A:
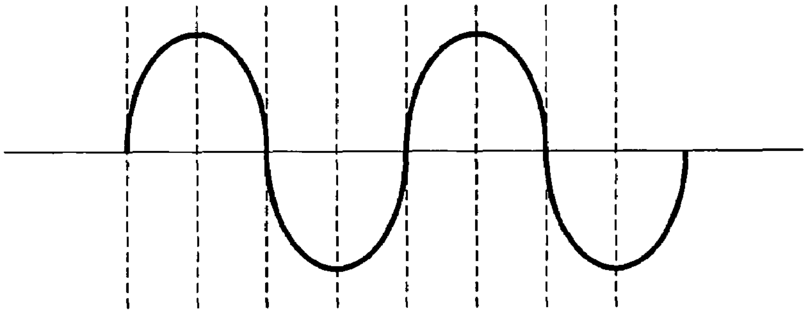
FIG. 5A is a diagram showing an example of an input signal of the phase detection circuit.
Figure 6A:
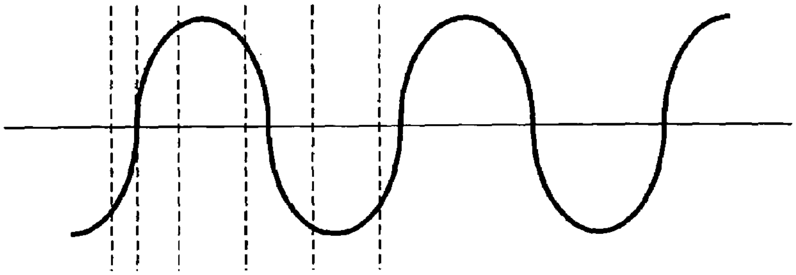
FIG. 6A is a diagram showing an example of an input signal of the phase detection circuit.

FIGS. 5A and 6A are diagrams each showing an example of the waveform of a signal (a signal corresponding to the input signal from the terminal 42*a* in the circuit configuration shown in FIG. 3) input to the phase detection circuit 50.

Figure 5B:
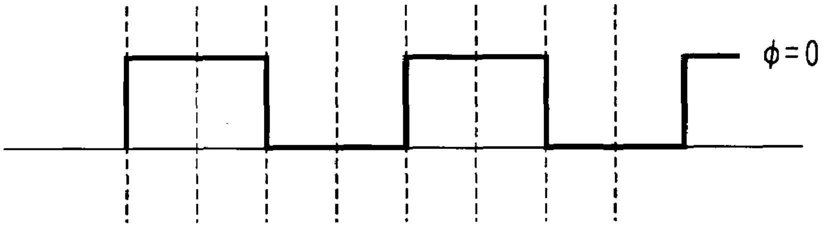
FIG. 5B is a diagram showing an example of a detection signal with respect to the input signal of FIG. 5A.
Figure 5C:
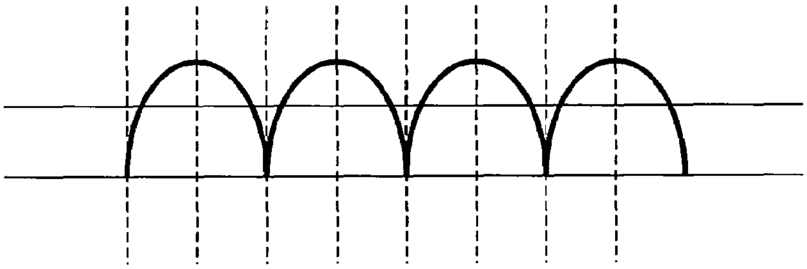
FIG. 5C is a diagram showing an example of an output signal obtained by subjecting the input signal of FIG. 5A to synchronous detection by use of the detection signal of FIG. 5B.
Figure 5D:
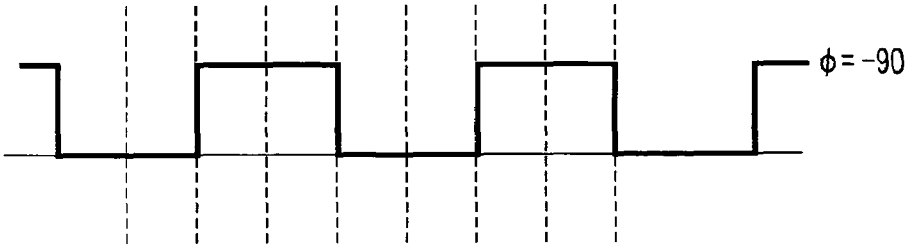
FIG. 5D is a diagram showing an example of a detection signal with respect to the input signal of FIG. 5A.
Figure 5E:
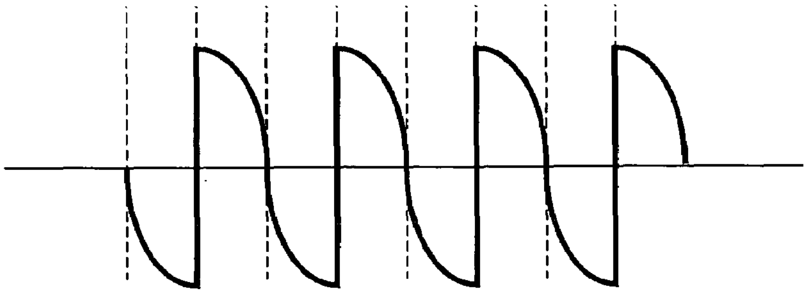
FIG. 5E is a diagram showing an example of an output signal obtained by subjecting the input signal of FIG. 5A synchronous detection by use of the detection signal of FIG. 5D.

FIGS. 5B and 5D are diagrams each showing an example of the waveform of a detection signal (which is a signal corresponding to the output signal of the comparator 55 in the circuit configuration of FIG. 3) with respect to the input signal of FIG. 5A. FIG. 5C is a diagram showing an example of the waveform of a signal (which is a signal corresponding to the output signal of the inverting amplifier 59 in the circuit configuration of FIG. 3) obtained by subjecting the input signal of FIG. 5A to synchronous detection by use of the detection signal of FIG. 5B. FIG. 5E is a diagram showing an example of the waveform of a signal (which is a signal corresponding to the output signal of the inverting amplifier 59 in the circuit configuration of FIG. 3) obtained by subjecting the input signal of FIG. 5A to synchronous detection by use of the detection signal of FIG. 5D.

Figure 6B:
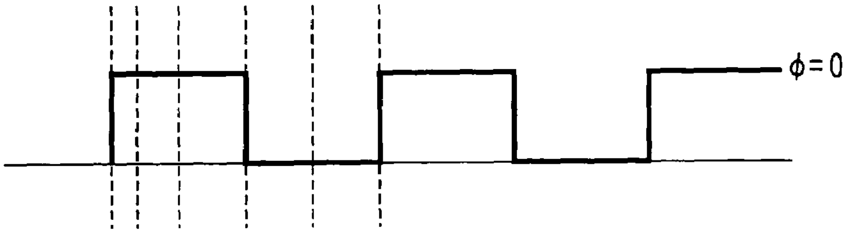
FIG. 6B is a diagram showing an example of a detection signal with respect to the input signal of FIG. 6A.
Figure 6C:
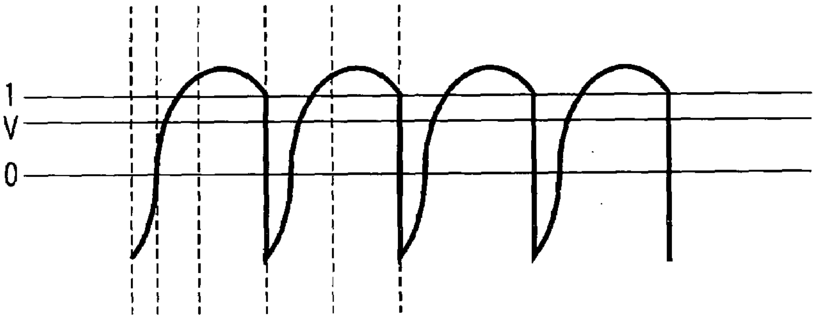
FIG. 6C is a diagram showing an example of an output signal obtained by subjecting the input signal of FIG. 6A to synchronous detection by use of the detection signal of FIG. 6B.
Figure 6D:
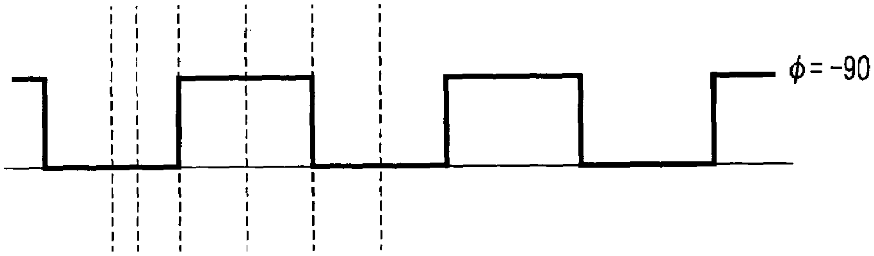
FIG. 6D is a diagram showing an example of a detection signal with respect to the input signal of FIG. 6A.
Figure 6E:
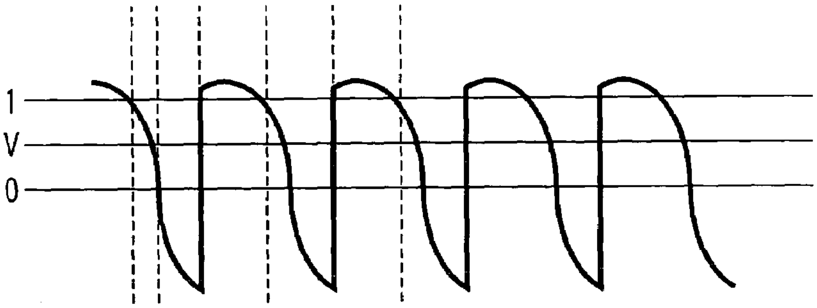
FIG. 6E is a diagram showing an example of an output signal obtained by subjecting the input signal of FIG. 6A to synchronous detection by use of the detection signal of FIG. 6D.

FIGS. 6B and 6D are diagrams each showing an example of the waveform of a detection signal (which is a signal corresponding to the output signal of the comparator 55 in the circuit configuration of FIG. 3) with respect to the input signal of FIG. 6A. FIG. 6C is a diagram showing an example of the waveform of a signal (which is a signal corresponding to the output signal of the inverting amplifier 59 in the circuit configuration of FIG. 3) obtained by subjecting the input signal of FIG. 6A to synchronous detection by use of the detection signal of FIG. 6B. FIG. 6E is a diagram showing an example of the waveform of a signal (which is a signal corresponding to the output signal of the inverting amplifier 59 in the circuit configuration of FIG. 3) obtained by subjecting the input signal of FIG. 6A to synchronous detection by use of the detection signal of FIG. 6D.

First, when the signal of FIG. 5A and a detection signal shown in FIG. 5B whose phase coincides with the phase of the input signal of FIG. 5A are input, the phase detection circuit outputs a signal obtained by subjecting the signal of FIG. 5A to full-wave rectification as shown in FIG. 5C. In this case, as the D.C. component of the signal shown in FIG. 5C, a D.C. component (for example, 1V) of a signal obtained by subjecting the signal of FIG. 5A to full-wave rectification is output.

On the other hand, when the signal of FIG. 5A and a detection signal shown in FIG. 5D whose phase is shifted by 90 degrees with respect to the phase of the input signal of FIG. 5A are input, the phase detection circuit outputs a signal of the waveform as shown in FIG. 5E. In this case, since the positive and negative components of the signal shown in FIG. 5E are the same, the D.C. component of the signal becomes 0V.

Further, when the signal shown in FIG. 6A and a detection signal of FIG. 6B whose phase is shifted by $\alpha$ ($0° < \alpha < 90°$) with respect to the phase of the input signal of FIG. 6A are input, the phase detection circuit outputs a signal as shown in FIG. 6C. In this case, since the signal shown in FIG. 6E contains positive and negative components, the D.C. component of the signal becomes smaller than the D.C. component (for example, 1V) obtained by subjecting the signal of FIG. 6A to full-wave rectification.

Further, when the signal shown in FIG. 6A and a detection signal of FIG. 6D whose phase is shifted by $(\alpha - 90°)$ ($0° < \alpha < 90°$) with respect to the phase of the input signal of FIG. 6A are input, the phase detection circuit outputs a signal as shown in FIG. 6E. Also, in this case, since the signal shown in FIG. 6E contains positive and negative components, the D.C. component of the signal becomes smaller than the D.C. component (for example, 1V) obtained by subjecting the signal of FIG. 6A to full-wave rectification.

Thus, in the phase detection circuit, when the phase of the input signal coincides with the phase of the detection signal, the input signal can be subjected to full-wave rectification. Further, if the phase of the input signal is shifted from the phase of the detection signal, the input signal cannot be subjected to full-wave rectification in the phase detection circuit. As a result, the D.C. component of the signal becomes smaller than the D.C. component of a signal subjected to full-wave rectification.

That is, in the phase detection circuit, an input signal is subjected to synchronous detection according to the phase of the detection signal. Therefore, if the phase of the detection signal is shifted from the phase of a signal to be detected, a characteristic that an output becomes small, but the influence of an unwanted signal contained in the input signal can be reduced can be attained in the phase detection circuit.

For example, when an unwanted signal such as noise is contained in the input signal, an output signal from which the influence of an unwanted signal contained in the input signal can be reduced can be obtained in the phase detection circuit. Therefore, in the phase detection circuit, a signal to be detected from the input signal can be solely detected with high precision by using a detection signal which is synchronized with the phase of a signal to be detected in the input signal.

Thus, according to the phase detection circuit 50 of FIG. 3, solely the signal (magnetic signal) which is synchronized with the output signal (detection signal) of the comparator 55 among the output signal of the differential amplifier 42 can be subjected to full-wave rectification. As a result, in the phase detection circuit 50, the magnetic signal acting as the output signal of the differential amplifier 42 can be subjected to full-wave rectification while reducing the influence of the signal which is not synchronized with the output signal of the comparator 50.

Further, in the magnetic material amount detecting apparatus 2, a magnetic signal indicating the amount of magnetic material contained in the to-be-detected medium P can be detected with high precision by applying the phase detection circuit 50 of FIG. 3 to the circuit configuration of FIG. 2. Particularly, when the amount of magnetic material contained in the to-be-detected medium P is extremely small, the magnetic signal contained in the output signal of the secondary winding 12 is a minute signal. Therefore, in order to detect the magnetic signal with high precision, it is necessary to reduce the influence of noise. Thus, the magnetic signal can be detected with high precision by subjecting a signal which is synchronized with the phase of the magnetic signal to full-wave rectification by use of the phase detection circuit 50.

As described above, in the magnetic material amount detecting apparatus 2, the phase of a signal detected from the primary winding 11 is adjusted by the phase adjusting circuit 51 so as to be synchronized with the phase of the magnetic signal obtained by the magnetic material of the to-be-detected medium P which is set close to the reading section 13 of the magnetic head 10. Then, the magnetic signal obtained from the magnetic material of the to-be-detected medium P as the output signal of the differential amplifier 42 is subjected to synchronous detection by use of the phase detection circuit 50 based on the signal whose phase is adjusted by the phase adjusting circuit 51. As a result, the phase of the signal used for synchronous detection can be adjusted according to the characteristic of the magnetic material and a magnetic signal indicating the amount of magnetic material contained in the to-be-detected medium P can be detected with high precision.

Next, a third embodiment of this invention is explained.

Figure 7:
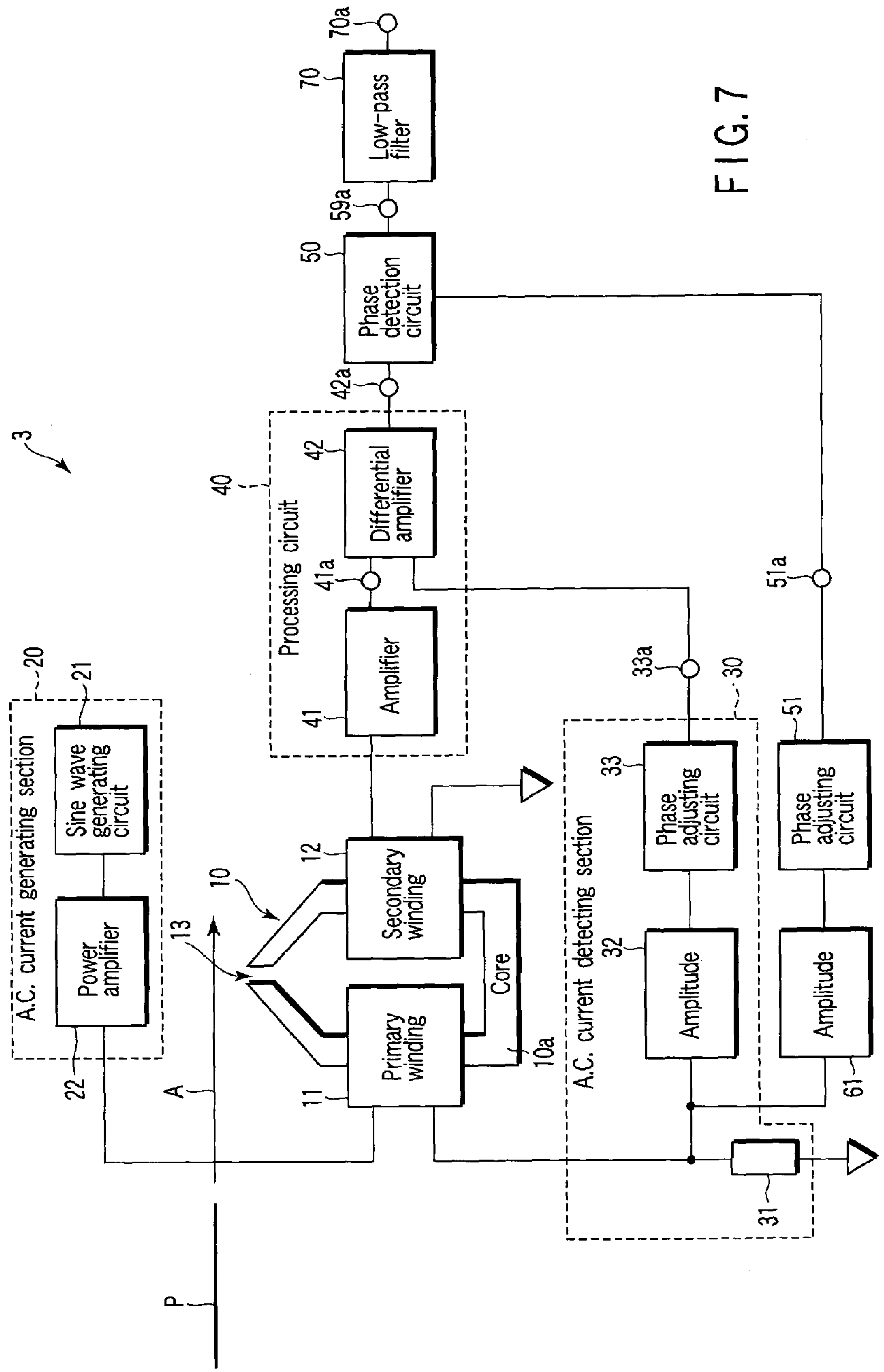
FIG. 7 is a diagram schematically showing an example of the configuration of a magnetic material amount detecting apparatus according to a third embodiment of this invention.

FIG. 7 is a diagram showing an example of the configuration of a magnetic material amount detecting apparatus 3 according to the third embodiment.

In the magnetic material amount detecting apparatus 3 shown in FIG. 7, portions which are the same as those of FIGS. 1 and 2 are denoted by the same reference symbols and the detail explanation thereof is omitted. As shown in FIG. 7, the magnetic material amount detecting apparatus 3 is obtained by additionally providing an amplitude adjusting circuit 61 in the preceding stage of the phase adjusting circuit 51 in the configuration of the magnetic material amount detecting apparatus 2 shown in FIG. 2.

That is, the amplitude adjusting circuit 61 is a circuit which adjusts the amplitude of an output signal of the primary winding 11 detected by the A.C. current detecting circuit 32. The signal whose amplitude is adjusted by the amplitude adjusting circuit 32 is input to the phase adjusting circuit 51. In the phase adjusting circuit 51, the phase of an output signal of the primary winding 11 whose amplitude is adjusted by the amplitude adjusting circuit 61 is adjusted. In the phase adjusting circuit 51, the phase of the output signal of the primary winding 11 is adjusted to be synchronized with the phase of a magnetic signal as explained in the second embodiment.

With the above configuration, the amplitude of a signal input to the phase adjusting circuit 51 can be adjusted by the amplitude adjusting circuit 61 in the magnetic material amount detecting apparatus 3. As a result, in the magnetic material amount detecting apparatus 3, the amplitude of a signal detected from the primary winding 11 can be adjusted to optimum amplitude as a signal which is used to form the rectangular wave as a detection signal with respect to the phase detection circuit 50 by the comparator. That is, according to the magnetic material amount detecting apparatus 3, the phase and amplitude of a signal used to form a detection signal can be adjusted separately from those adjusted by the amplitude adjusting circuit 32 and phase adjusting circuit 33.

Next, a fourth embodiment of this invention is explained.

Figure 8:
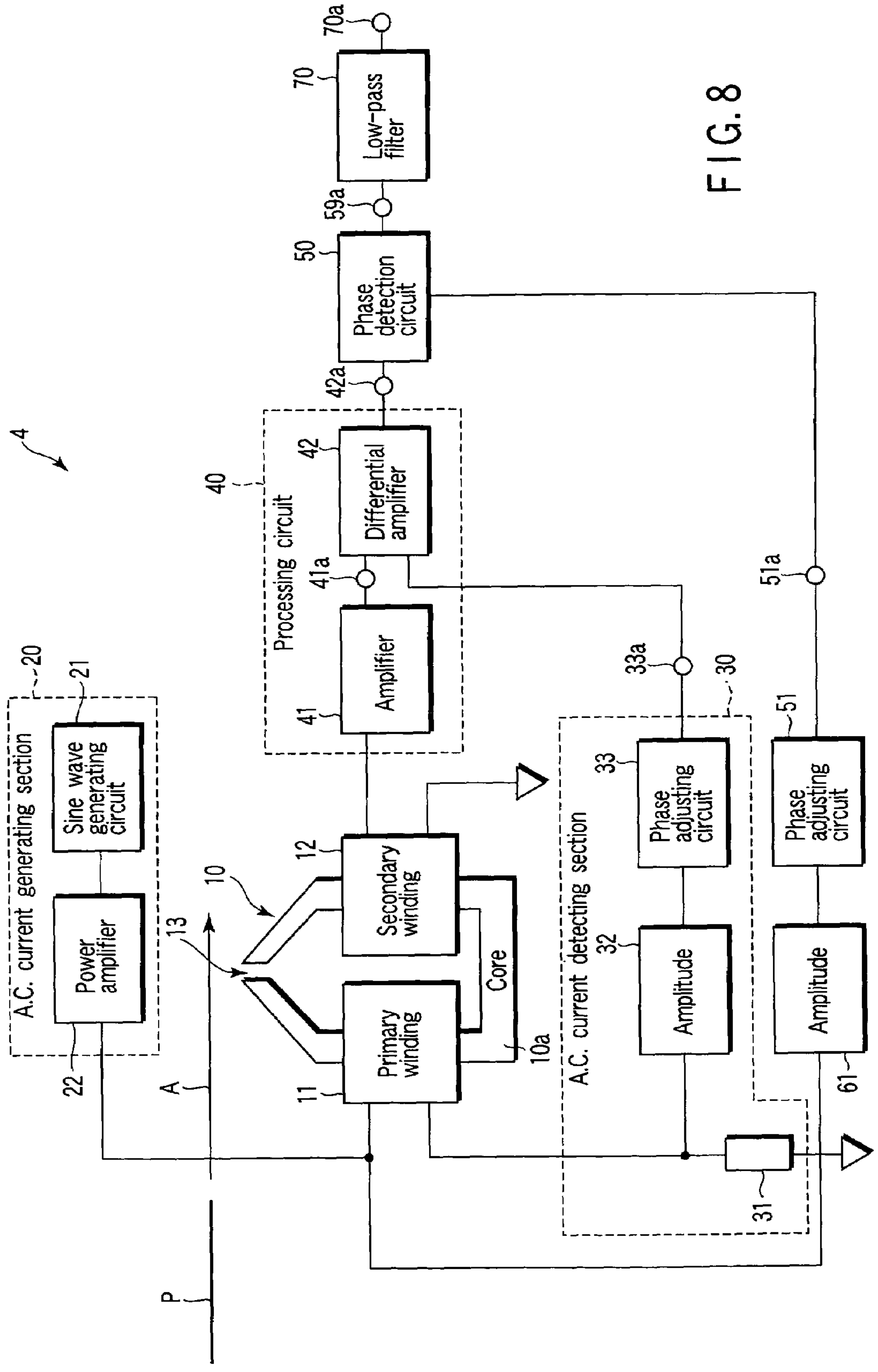
FIG. 8 is a diagram schematically showing an example of the configuration of a magnetic material amount detecting apparatus according to a fourth embodiment of this invention.

FIG. 8 is a diagram showing an example of the configuration of a magnetic material amount detecting apparatus 4 according to the fourth embodiment.

In the magnetic material amount detecting apparatus 4 shown in FIG. 8, portions which are the same as those of FIGS. 1, 2 and 3 are denoted by the same reference symbols and the detail explanation is omitted. As shown in FIG. 8, the magnetic material amount detecting apparatus 4 has a configuration obtained by connecting the input terminal of the amplitude adjusting circuit 61 to the output terminal side (input terminal side of the primary winding 11) of the power amplifier 22 of the A.C. current generating circuit 20 in the configuration of the magnetic material amount detecting apparatus 2 shown in FIG. 3.

That is, the amplitude adjusting circuit 61 directly inputs an output signal (a signal input to the primary winding 11) of the power amplifier 22 of the A.C. current generating circuit 20. Therefore, an output signal of the power amplifier 22 of the A.C. current generating circuit 20 whose amplitude and phase are adjusted by the amplitude adjusting circuit 61 and phase adjusting circuit 51 is input to the comparator 55 of the phase detection circuit 50.

With the above configuration, according to the magnetic material amount detecting apparatus 4, the same effect as that of the magnetic material amount detecting apparatus 3 explained in the third embodiment can be attained. Further, according to the magnetic material amount detecting apparatus 4, the phase detection circuit 50 can form a detection signal based on a signal input to the primary winding 11.

As described above, according to the above embodiments, a signal which varies in proportion to the amount of magnetic material contained in the to-be-detected medium P can be detected with high precision by use of one magnetic head with the configuration which is simple and inexpensive and has primary and secondary windings. Therefore, according to the above embodiments, a magnetic material amount detecting apparatus can be provided which has an inexpensive magnetic head and which obviates the need for a magnetic head of an A.C. excitation current system or differential winding type transform system when a signal which varies in proportion to the amount of magnetic material is detected.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic material amount detecting apparatus which detects an amount of a magnetic material contained in a to-be-detected medium, comprising:

a magnetic head having primary and secondary windings mounted on a core having a reading section to which the to-be-detected medium is set to be close, a current supply circuit which supplies a current to the primary winding of the magnetic head, an adjusting circuit which adjusts an output signal from the primary winding, and a processing circuit which outputs a difference between the output signal output from the primary winding adjusted by the adjusting circuit and an output signal from the secondary winding.

2. The magnetic material amount detecting apparatus according to claim 1, further comprising an amplifier which amplifies the output signal from the secondary winding of the magnetic head, wherein the processing circuit outputs a difference between the output signal output from the primary winding and an output signal from the amplifier.

3. The magnetic material amount detecting apparatus according to claim 1, further comprising a resistor serially connected to the primary winding of the magnetic head, wherein the adjusting circuit adjusts an output signal detected from the primary winding by use of a voltage effect of the resistor.

4. The magnetic material amount detecting apparatus according to claim 1, wherein the adjusting circuit is set to minimize a signal output from the processing circuit when no magnetic material is present near the reading section of the magnetic head.

5. The magnetic material amount detecting apparatus according to claim 1, wherein the adjusting circuit has a circuit which adjusts amplitude and phase of the output signal from the primary winding.

6. A magnetic material amount detecting apparatus which detects an amount of a magnetic material contained in a to-be-detected medium, comprising:

a magnetic head having primary and secondary windings mounted on a core having a reading section to which the to-be-detected medium is set to be close, a current supply circuit which supplies a current to the primary winding of the magnetic head, an adjusting circuit which adjusts an output signal from the primary winding, and a processing circuit which outputs a difference between the output signal output from the primary winding adjusted by the adjusting circuit and an output signal from the secondary winding; and wherein the processing circuit has a differential amplifier which outputs a difference between the output signal from the secondary winding and the output signal output from the primary winding and adjusted by the adjusting circuit.

7. The magnetic material amount detecting apparatus according to claim 6, further comprising an amplifier which amplifies the output signal from the secondary winding of the magnetic head, wherein the processing circuit outputs a difference between the output signal output from the primary winding and an output signal from the amplifier.

8. The magnetic material amount detecting apparatus according to claim 6, further comprising a resistor serially connected to the primary winding of the magnetic head, wherein the adjusting circuit adjusts an output signal detected from the primary winding by use of a voltage effect of the resistor.

9. The magnetic material amount detecting apparatus according to claim 6, wherein the adjusting circuit is set to minimize a signal output from the processing circuit when no magnetic material is present near the reading section of the magnetic head.

10. The magnetic material amount detecting apparatus according to claim 6, wherein the adjusting circuit has a circuit which adjusts amplitude and phase of the output signal from the primary winding.

11. A magnetic material amount detecting apparatus which detects an amount of a magnetic material contained in a to-be-detected medium, comprising:

a magnetic head having primary and secondary windings mounted on a core having a reading section to which the to-be-detected medium is set to be close, a current supply circuit which supplies a current to the primary winding of the magnetic head, an adjusting circuit which adjusts an output signal from the primary winding, and a processing circuit which outputs a difference between the output signal output from the primary winding adjusted by the adjusting circuit and an output signal from the secondary winding;

a rectifier which rectifies an output signal of the processing circuit, and a low-pass filter which outputs a signal obtained by smoothing an output signal of the rectifier as a signal corresponding to the amount of magnetic material contained in the to-be-detected medium.

12. A magnetic material amount detecting apparatus which detects a magnetic material contained in a to-be-detected medium, comprising:

a magnetic head having primary and secondary windings mounted on a core having a reading section to which the to-be-detected medium is set to be close, a current supply circuit which supplies a current to the primary winding of the magnetic head, a first adjusting circuit which adjusts an output signal from the primary winding, a processing circuit which outputs a difference between the output signal output from the primary winding and adjusted by the first adjusting circuit and an output signal from the secondary winding, a second adjusting circuit which adjusts the output signal from the primary winding, and a phase detection circuit which outputs a signal obtained by subjecting an output signal of the processing circuit to phase detection based on the output signal output from the primary winding and adjusted by the second adjusting circuit.

13. The magnetic material amount detecting apparatus according to claim 12, further comprising a low-pass filter which outputs an output signal of the phase detection circuit as a smoothed D.C. signal.

14. The magnetic material amount detecting apparatus according to claim 12, further comprising an amplifier which amplifies the output signal from the secondary winding of the magnetic head, wherein the processing circuit outputs a difference between the output signal output from the primary winding and an output signal from the amplifier.

15. The magnetic material amount detecting apparatus according to claim 12, further comprising a resistor serially connected to the primary winding of the magnetic head, wherein the first adjusting circuit adjusts an output signal detected from the primary winding by use of a voltage effect of the resistor.

16. The magnetic material amount detecting apparatus according to claim 12, wherein the first adjusting circuit is set to minimize a signal output from the processing circuit when no magnetic material is present near the reading section of the magnetic head.

17. The magnetic material amount detecting apparatus according to claim 12, wherein the first adjusting circuit has a circuit which adjusts amplitude and phase of the output signal from the primary winding.

18. The magnetic material amount detecting apparatus according to claim 12, wherein the processing circuit has a differential amplifier which outputs a difference between the output signal from the secondary winding and the output signal output from the primary winding and adjusted by the first adjusting circuit.

19. The magnetic material amount detecting apparatus according to claim 12, wherein the second adjusting circuit includes a circuit which adjusts the phase of the signal from the primary winding to a phase which is synchronized with the phase of a signal contained in the output signal of the processing circuit and indicating the amount of magnetic material of the to-be-detected medium.

20. The magnetic material amount detecting apparatus according to claim 12, wherein the second adjusting circuit includes a circuit which adjusts amplitude of the output signal from the primary winding, and a circuit which adjusts the phase of the signal from the primary winding to a phase which is synchronized with the phase of a signal contained in the output signal of the processing circuit and indicating the amount of magnetic material of the to-be-detected medium.

* * * * *